United States Patent

Schmolla et al.

Patent Number: 5,969,480
Date of Patent: Oct. 19, 1999

[54] IGNITION SYSTEM WITH A FIELD EMITTER COUPLED TO THE SPARK PLUG

[75] Inventors: Wilfried Schmolla, Dietzenbach; Norbert Marschall, Frankfurt, both of Germany

[73] Assignee: Daimler-Benz Aktiengesellschaft, Stuttgart, Germany

[21] Appl. No.: 08/860,354

[22] PCT Filed: Dec. 20, 1995

[86] PCT No.: PCT/EP95/05055

§ 371 Date: Jun. 20, 1997

§ 102(e) Date: Jun. 20, 1997

[87] PCT Pub. No.: WO96/19663

PCT Pub. Date: Jun. 27, 1996

[30] Foreign Application Priority Data

Dec. 20, 1994 [DE] Germany ............................ 44 45 467

[51] Int. Cl.[6] .................................................. F02P 7/03
[52] U.S. Cl. .................................. 315/209 M; 315/169.1
[58] Field of Search ........................... 315/209 R, 209 T, 315/209 M, 169.1

[56] References Cited

U.S. PATENT DOCUMENTS

| | | | |
|---|---|---|---|
| 3,840,955 | 10/1974 | Hagood et al. | 313/309 |
| 4,044,747 | 8/1977 | Longstaff | 315/209 T X |
| 5,012,153 | 4/1991 | Atkinson et al. | 313/336 |
| 5,109,829 | 5/1992 | Herden et al. | 123/643 |
| 5,359,256 | 10/1994 | Gray | 315/169.1 X |
| 5,397,964 | 3/1995 | Edwards | 315/209 M X |

FOREIGN PATENT DOCUMENTS

| | | |
|---|---|---|
| 0463800 | 1/1992 | European Pat. Off. . |
| 0463842 | 1/1992 | European Pat. Off. . |
| 3722666 | 1/1989 | Germany . |
| 4209301 | 8/1993 | Germany . |

*Primary Examiner*—Robert Pascal
*Assistant Examiner*—Justin P. Bettendorf
*Attorney, Agent, or Firm*—Venable; Norman N. Kunitz; Michael A. Sartori

[57] ABSTRACT

An ignition system supplies high-voltage to spark plugs via field emitters. An ignition control device produces the ignition cycle for the ignition system and controls the ignition process of the ignition system. The field emitters couple the ignition control device to the spark plugs. The field emitters switch and regulate the high-voltage for the spark plugs.

12 Claims, 2 Drawing Sheets

IGNITION SYSTEM WITH A FIELD EMITTER COUPLED TO THE SPARK PLUG

BACKGROUND OF THE INVENTION

The invention concerns an ignition system.

Electronic components in the motor vehicle, and in particular in the engine compartment, must meet special demands. On the one hand, the semiconductor components must tolerate high temperatures and, on the other hand, the components must meet extremely high demands if the high voltage necessary for the ignition is applied directly to the semiconductor components. In order to accept the high voltages, several semiconductor components must be connected in series. This is expensive and involved. Still, a destruction of the components through excess voltages cannot be ruled out with certainty.

An ignition distributor arrangement is known from DE 37 22 666 A1, where the ignition pulses supplied by the ignition coil are fed by way of semiconductor components to the spark plug. The semiconductor components in this case are switched by exposing them to light.

Field emitters are known, among other things, from publications by C. Spindt, Stanbord Research Institute. So far, they have primarily been used for displays.

The field emitter, a vacuum microelectronic component, utilizes the controlled emission of electrons from a metal tip or edge into the vacuum. FIG. 1 shows the basic configuration of a vertical field emitter with field-emission cathode and the tunnel effect. The metal tip is located in a high electrical field at room temperature.

As a result of the metal tip shape, field strength magnifications up to the range of several $10^7$ V/cm are possible. These field strengths are sufficient for permitting electrons to tunnel through the potential barrier at the work function level. Owing to the small distance between cathode tip and edge of the gate hole and the considerably larger distance to the anode for voltages of the same order of magnitude on both electrodes, it is essentially the gate voltage that determines the field strength prevailing for the field emission at the cathode.

After leaving the tip, the electrons are accelerated near the cathode already to a noticeable amount of the final speed, in contrast to the emission from thermal cathodes. Their movement direction is essentially determined by the angle of emission, as long as the anode voltage is higher than the gate voltage. If the anode voltage is lower than the gate voltage, then the electrons are decelerated near the anode. Some electrons (with a high angle to the rotational axis of the tip) reverse their movement direction and move toward the gate. The remaining electrons reach the anode. Some of them are reflected by the anode and also move toward the gate. Since the electron movement speeds near the anode are very low, it is possible for space charges to form at high currents, which increase the decelerating electrical field.

In-depth studies of the space charges are still the subject matter of research. An anode and a gate current are flowing. In addition to the voltage ratio at the anode and the gate, the current ratio depends in a complex way on the geometric arrangement.

SUMMARY OF THE INVENTION

It is the object of the invention to provide high-voltage control elements for an ignition system, which are capable of switching and regulating the high voltages for the spark plug.

The advantages of the invention lie above all in a noticeable increase in the service life of the ignition system, in particular the spark plugs, which become practically maintenance-free.

Exemplary embodiments of the invention are described in more detail in the following with the aid of the drawings.

DETAILED DESCRIPTION OF THE INVENTION

In accordance with the invention, field emitter arrays with approximately $10^4$ to $10^5$ single emitters are particularly suited as control elements in ignition systems for internal combustion engines, owing to the ability to control high blocking voltages and at times flows up to the mA range. These $10^4$ to $10^5$ single field emitters are laid with integrated technology out over an area of approximately 1 mm$^2$.

Embodiment 1

Figure 1:
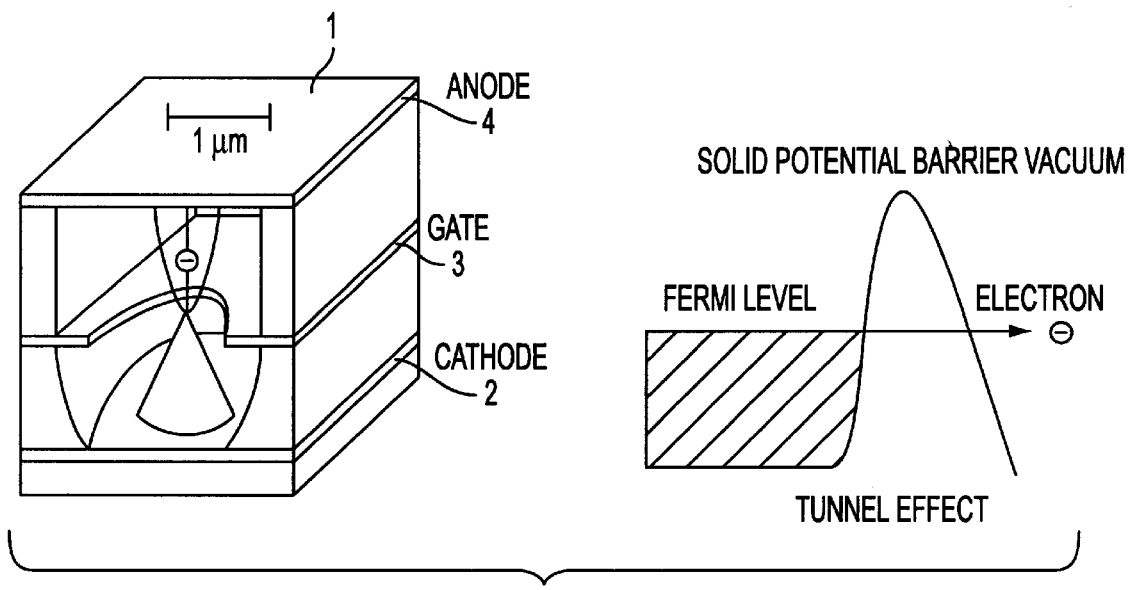
FIG. 1 The field emission principle from a single tip (Prior Art)
Figure 2:
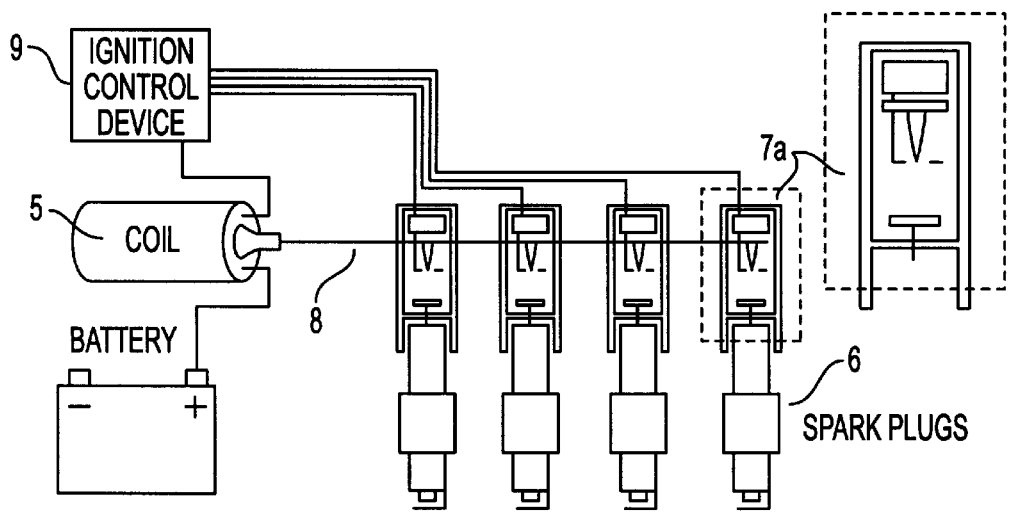
FIG. 2 The basic circuit diagram for an ignition system with field emission switches and a conventional inition coil (embodiment 1)

For a preferred embodiment of the invention, the known mechanical ignition distributor is replaced with electronic high-voltage switches (field emitters). The remaining ignition system remains the same relative to the known system with mechanical distributor and ignition coil. The principle with the new type of electronic distributing switches using field emitters 7a is shown in FIG. 2.

The voltage for the ignition process and the energy for the subsequent burning process of the spark plug is supplied by a coil 5 and is fed to a high-voltage bus 8, which connects the high-voltage switches 7a.

For an ignition process, the coordinated electronic switch is switched on by the ignition control device 9 via a control line. Subsequently, the high voltage builds up until the point in time for ignition, and the spark plug operating current flows over the microelectronic distribution switch 7a. Following the end of the burning process and the discharge of the ignition energy, the distribution switch is turned off again.

The operating conditions for an exemplary microelectronic distribution switch in an ignition system are compiled in Table 1. The values, which depend on time and number of revolutions, are average values. The ignition voltage for igniting the burning process is 15 to 25 kV. Following the ignition, the high voltage breaks down to about 5000 V operating voltage as a result of the current flow of approximately 40 mA. The burning time is approximately 0.5 to 2 ms. The process is repeated every 6 ms for the ignition voltage bus at 5000 RPM for a four-cylinder motor and for each individual microelectronic distribution switch every 24 ms. Assuming that the field emitter array is operated at 100 V gate-cathode voltage and approximately 100 V anode-cathode voltage, this results in a power loss in the component of 0.33 W. No special cooling measures are required for the aforementioned power loss.

TABLE 1

Operating conditions for a microelectronic distribution switch in an ignition system

| | |
|---|---|
| ignition voltage | 15 to 25 kV |
| burning time | 2 ms |
| operating voltage | 500 V |
| spark plug current | 40 mA (average value) |
| cycle | 24 ms (5000 RPM) |
| ratio one/cycle | 1:12 |
| voltage drop | 100 V (anode, cathode) |
| power loss | 0.33 W (per field emitter) |

The vacuum microelectronic high voltage switches and electrical feed wires can be housed in a small housing, for which the estimated size of 2 cm$^3$ is essentially determined by the cable connections for the high voltage bus and the selection line and the spark plug connector. The housing can be slipped directly onto the spark plug.

The size of the housing with the high-voltage switches can be compared to the size of present-day spark-plug connectors.

A field emitter as controllable high-voltage series resistance switches 7a opens up possibilities for new-type ignition systems, including new-type spark plugs.

Embodiment 2.

Figure 3:
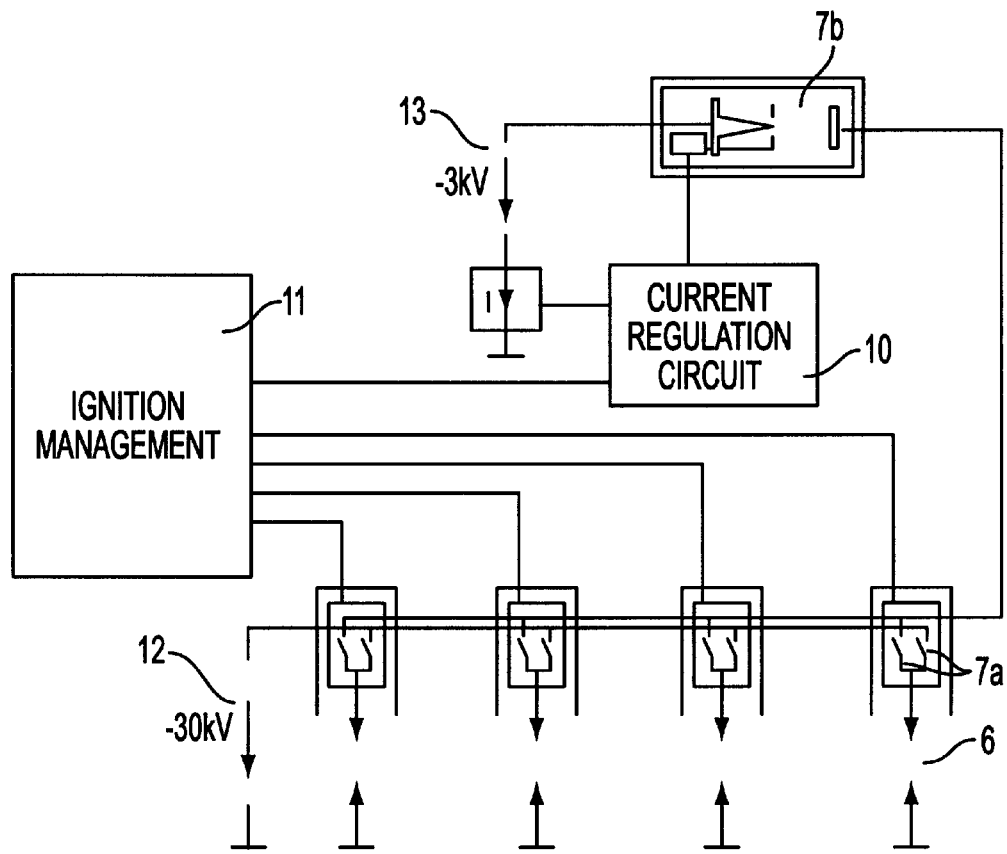
FIG. 3 The basic circuit diagram of an ignition system with field emitter switches and current regulation for the supply from two voltage sources (embodiment 2) and FIG. 4 The equivalent circuit diagram for the secondary circuit of an ignition system with ignition coil.

FIG. 3 shows an ignition concept for a regulated ignition current as an additional exemplary embodiment. The number 10 stands for the current regulation for the field emitter 7b and the number 11 for the ignition management. Two voltage sources with 30 kV and 3 kV are provided for the total ignition and burning process. The indicated voltage values must be understood to be reference values.

The start of the ignition process, which is characterized by the production of electrical charge carriers between the spark plug electrodes is caused in Embodiment 2 by connecting a high-voltage bus 12 with applied high voltage of 30 kV to a spark plug electrode via the field emitter switch 7a.

Following the start of the ignition process, the 30 kV voltage source is separated after a short period from the spark plug by opening the field emitter switch, 7a and a source with current that can be regulated and has a voltage range of 300 V to 3 kV is switched via another field emitter 7b to the spark plug electrode without interrupting the ignition process, thus continuing the discharge. The additional discharge operation requires several ms. For voltage a source in the range of 300 V to 3 kV in combination with the field emittir, a burning time of 0.5 to 5 ms is obtained. The regulated current source comprises the 3 kV voltage source and the regulation circuit 10 with the field emitter 7b. The regulation circuit 10 adjusts the current flowing through the spark plug 6 to a value in the range of 20 to 200 mA. The function of the current regulation through the field emitter element 7b can also be met in integrated form as additional function of field emitter element 7a.

The previously described ignition system (Embodiment 2) with current control shows how the combustion inside the cylinder chamber can be controlled through direct intervention into the spark plug circuit. Until now, there were no suitable and reliable high-voltage components for the high-voltage circuit for the spark plugs.

In the ignition system with a mechanical distributor, the feed and spark plug capacities with peak flows that cause a high share of the wear on a spark plug are discharged immediately after the ignition.

Figure 4:
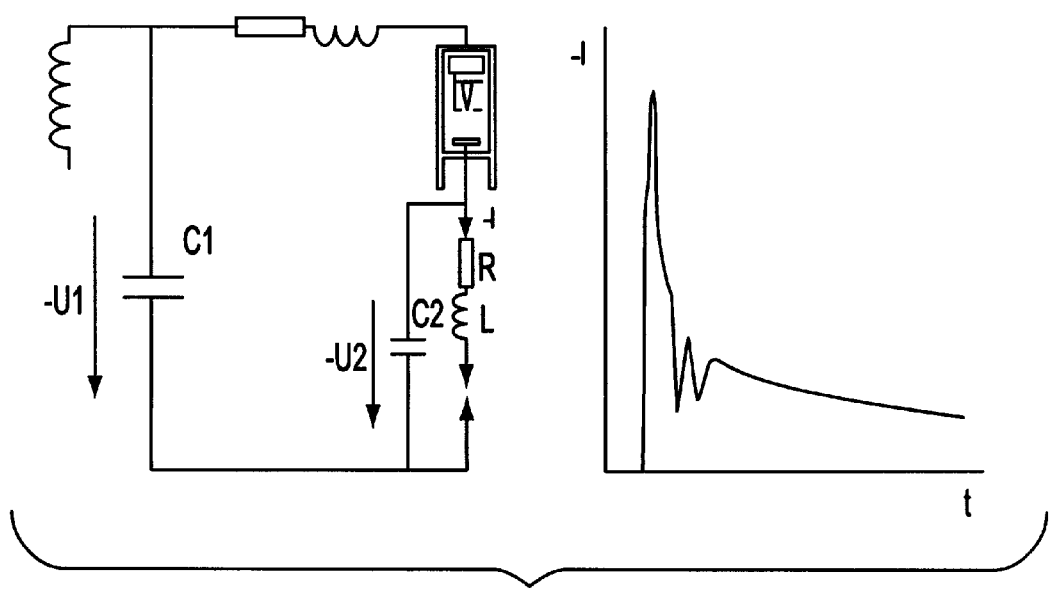

With the microelectronic distribution switch 7a in FIG. 2 or FIG. 3, the discharge current for supplying and building up of capacitance C1 is advantageously limited by a value $I_{GR}$ that is adjusted through the gate voltage. A basic circuit layout and current curve are shown in FIG. 4. The limiting of the current permits a clear extension of the service life of the spark plug.

FIG. 4 shows a simplified equivalent circuit diagram of the secondary circuit for the ignition system shown in FIG. 2, with microelectronic distribution switch and the basic, time-dependent curve for the spark plug current just after the ignition. The high voltage at the coil is designated with U1, the voltage at the spark plug with U2, the feed line capacitance with C1, the spark plug capacitance with C2 and the spark plug current with i.

A system advantage of an ignition system with high-voltage switches or controllable series resistances on the high-voltage side lies in the possibility of actively controlling the burning time of the spark plug or the current. Since the service life of the spark plug (erosion) has an almost linear dependence on the quantity of charge flowing over the spark plugs, the spark plug maintenance intervals can be extended by adjusting the burning time or current control to the operating state of the engine. By using a spark plug with long service life together with an integrated electronic monitoring of the spark plug condition, the spark plug maintenance intervals could be omitted. The service life for the spark plug can thus reach the service life of the engine.

In addition, the specific control of the point in time for the ignition, the discharge time as well as the discharge current level offer new possibilities in modern engine management for a considerable further optimizing of the combustion process, e.g. reduction in exhaust gas and wear.

What is claimed is:
1. An ignition system comprising:
   a spark plug;
   a high-voltage source coupled to the spark plug and for generating and maintaining an ignition spark in the spark plug;
   an ignition control device coupled to the spark plug and the high-voltage source, for producing an ignition cycle in the ignition system, and for controlling an ignition process of the ignition system;
   a field emitter for coupling the spark plug to the high-voltage source and the ignition control device;
   an operating voltage source; and
   a second field emitter for coupling the operating voltage source to the field emitter.
2. An ignition system according to claim 1, wherein the field emitter comprises a vacuum microelectronic field emitter having a cathode, a gate, and an anode.
3. An ignition system according to claim 1, wherein the field emitter comprises a cathode and an anode, the anode of the field emitter being coupled to the spark plug;
   wherein the high-voltage source produces a high voltage;
   wherein the ignition system further comprises an ignition voltage bus coupling the high-voltage source to the cathode of the field emitter and for supplying the high voltage of the high-voltage source to the cathode of the field emitter; and
   wherein the ignition control device controls the ignition process of the ignition system by adjusting timing and duration of the ignition process.

4. An ignition system according to claim 1, wherein the ignition system produces an ignition voltage of approximately 15 to 30 kV.

5. An ignition system according to claim 1 further comprising:
   a housing for housing the field emitter, the housing slipping directly onto the spark plug.

6. An ignition system according to claim 1 further comprising:
   a current regulation device coupled to the field emitter and for adjusting a current flowing through the spark plug.

7. An ignition system according to claim 6, wherein the current flowing through the spark plug and adjusted by the current regulation device is in the range of 20 to 200 mA.

8. An ignition system according to claim 1, wherein the operating voltage source is in the range of 300 V to 3 kV.

9. An ignition system according to claim 1, wherein the ignition system has a burning time of 0.5 to 5 ms.

10. An ignition system according to claim 1, wherein the field emitter comprises approximately $10^4$ to $10^5$ single vacuum microelectronic elements.

11. An ignition system according to claim 1, wherein the field emitter regulates current to the spark plug.

12. An ignition system according to claim 1, wherein the ignition control device controls a burning time of the spark plug.

* * * * *